United States Patent
Sohda et al.

(10) Patent No.: US 11,251,018 B2
(45) Date of Patent: Feb. 15, 2022

(54) SCANNING ELECTRON MICROSCOPE

(71) Applicant: Hitachi High-Tech Corporation, Tokyo (JP)

(72) Inventors: Yasunari Sohda, Tokyo (JP); Kaori Bizen, Tokyo (JP); Yusuke Abe, Tokyo (JP); Kenji Tanimoto, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 0 days.

(21) Appl. No.: 17/255,724

(22) PCT Filed: Jul. 2, 2018

(86) PCT No.: PCT/JP2018/025029
§ 371 (c)(1),
(2) Date: Dec. 23, 2020

(87) PCT Pub. No.: WO2020/008492
PCT Pub. Date: Jan. 9, 2020

(65) Prior Publication Data
US 2021/0272770 A1 Sep. 2, 2021

(51) Int. Cl.
*H01J 37/28* (2006.01)
*H01J 37/12* (2006.01)
(Continued)

(52) U.S. Cl.
CPC .............. *H01J 37/28* (2013.01); *H01J 37/12* (2013.01); *H01J 37/1477* (2013.01);
(Continued)

(58) Field of Classification Search
CPC ..... H01J 2237/1532; H01J 2237/24475; H01J 2237/2448; H01J 2237/2817; H01J 2237/21
(Continued)

(56) References Cited

U.S. PATENT DOCUMENTS 4,785,182 A 11/1988 Mancuso et al.
8,618,499 B1 12/2013 Hoque et al.
(Continued)

FOREIGN PATENT DOCUMENTS

EP 2 833 390 A1 2/2015
JP 1-309243 A 12/1989
(Continued)

OTHER PUBLICATIONS

International Search Report (PCT/ISA/210) issued in PCT Application No. PCT/JP2018/025029 dated Aug. 21, 2018 with English translation (four (4) pages).
(Continued)

*Primary Examiner* — Jason L McCormack
(74) *Attorney, Agent, or Firm* — Crowell & Moring LLP

(57) ABSTRACT

Provided is a scanning electron microscope which can perform high-speed focus correction even when an electron beam having high energy is used. The scanning electron microscope includes an electron optical system including an electron source 100 that emits an electron beam and an objective lens 113, a sample stage 1025 which is disposed on a stage 115 and on which a sample 114 is placed, a backscattered electron detector 1023 which is disposed between the objective lens and the sample stage and is configured to detect backscattered electrons 1017 emitted due to interaction between the electron beam and the sample, a backscattered electron detection system control unit 138 which is provided corresponding to the backscattered electron detector and is configured to apply a voltage to the backscattered electron detector, and a device control calculation device 146. The objective lens has an opening in a stage direction, and the device control calculation device performs focus correction of the electron beam by controlling the voltage applied to the backscattered electron detec-
(Continued)

tor from the backscattered electron detection system control unit.

13 Claims, 7 Drawing Sheets

(51) Int. Cl.
    *H01J 37/147* (2006.01)
    *H01J 37/153* (2006.01)
    *H01J 37/21* (2006.01)
    *H01J 37/244* (2006.01)
    *H01J 37/26* (2006.01)

(52) U.S. Cl.
    CPC ............ *H01J 37/153* (2013.01); *H01J 37/21* (2013.01); *H01J 37/244* (2013.01); *H01J 37/265* (2013.01); *H01J 2237/1532* (2013.01); *H01J 2237/2448* (2013.01); *H01J 2237/24475* (2013.01); *H01J 2237/2817* (2013.01)

(58) Field of Classification Search
    USPC .......................................... 250/306, 307, 311
    See application file for complete search history.

(56) References Cited

U.S. PATENT DOCUMENTS

| 2006/0060790 | A1 | 3/2006 | Nakasuji et al. | |
| 2008/0277584 | A1* | 11/2008 | Kim | H01J 37/063 |
| | | | | 250/311 |
| 2013/0277554 | A1* | 10/2013 | Ren | H01J 37/261 |
| | | | | 250/310 |
| 2017/0169990 | A1* | 6/2017 | Koo | H01J 37/20 |

FOREIGN PATENT DOCUMENTS

| JP | 5-174768 A | 7/1993 |
| JP | 2005-158642 A | 6/2005 |
| JP | 2007-95576 A | 4/2007 |
| JP | 2014-22165 A | 2/2014 |
| JP | 2015-210998 A | 11/2015 |

OTHER PUBLICATIONS

Japanese-language Written Opinion (PCT/ISA/237) issued in PCT Application No. PCT/JP2018/025029 dated Aug. 21, 2018 (four (4) pages).

* cited by examiner

[FIG. 1]
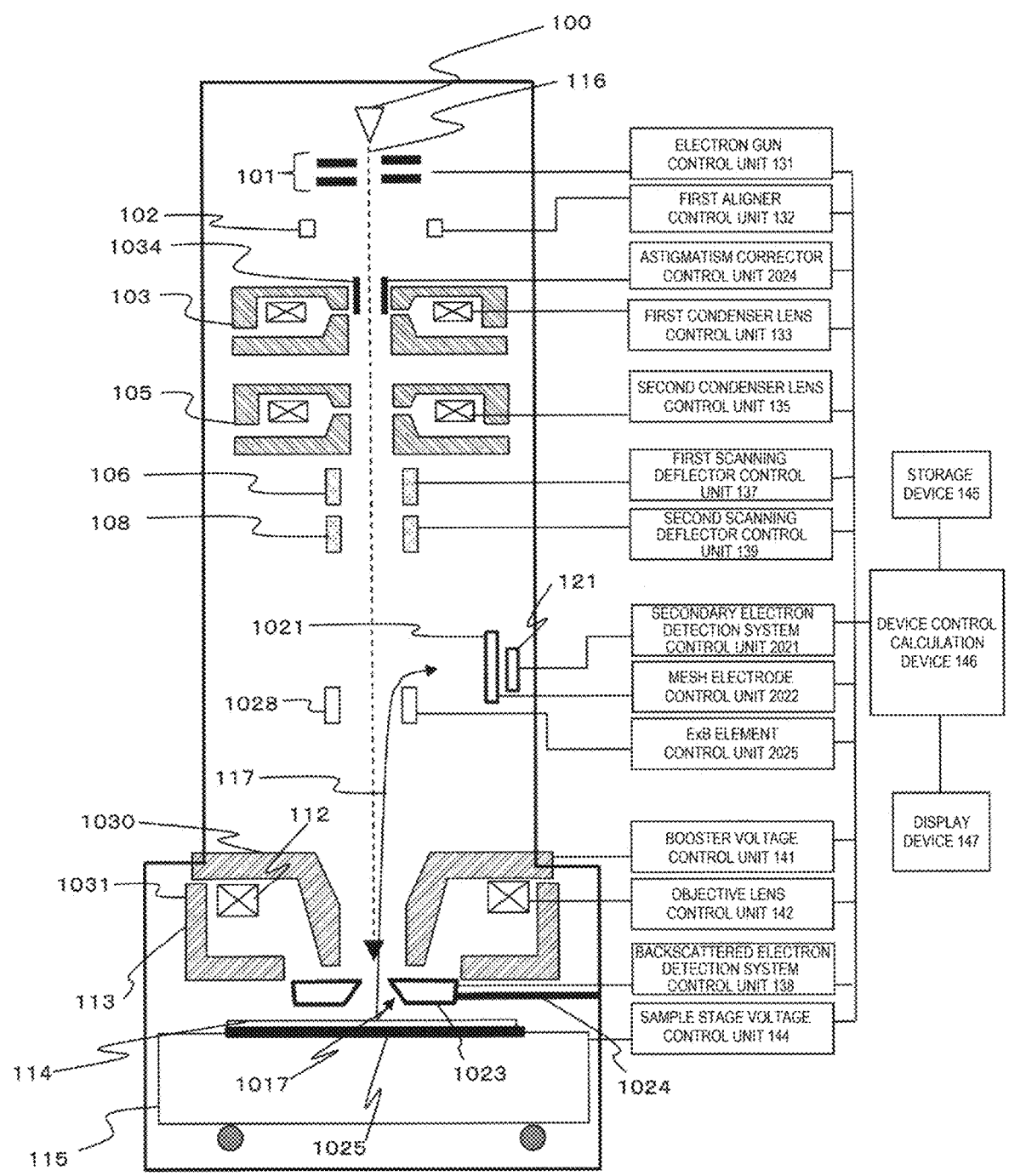

[FIG. 2]
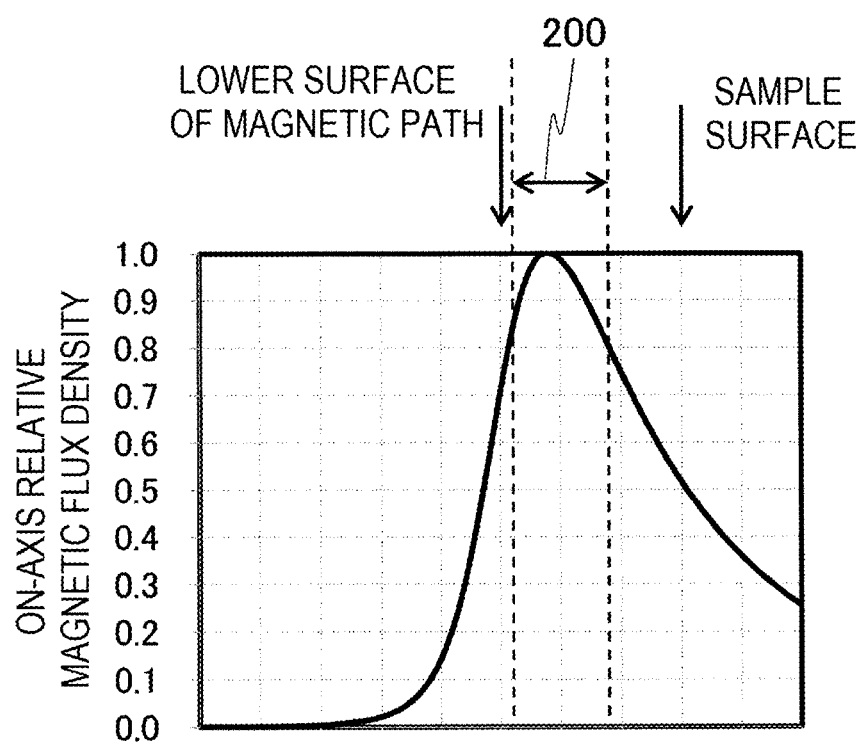

[FIG. 3]
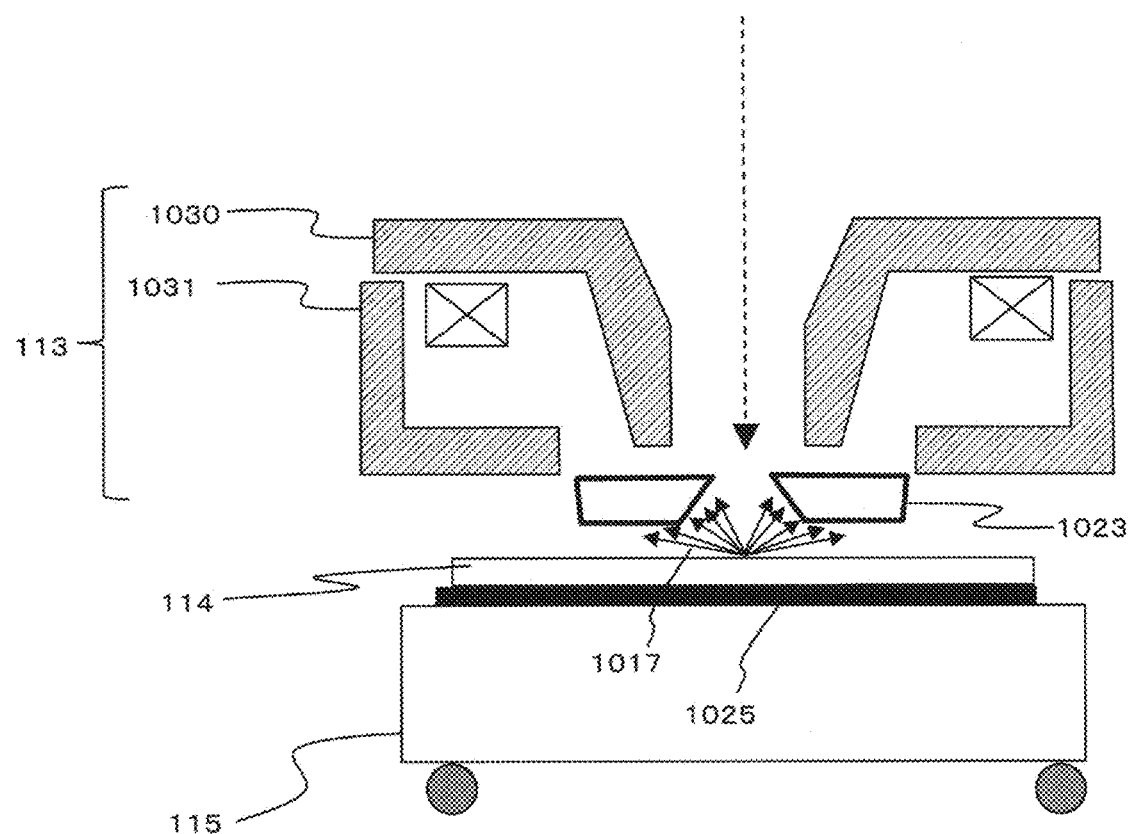

[FIG. 4]
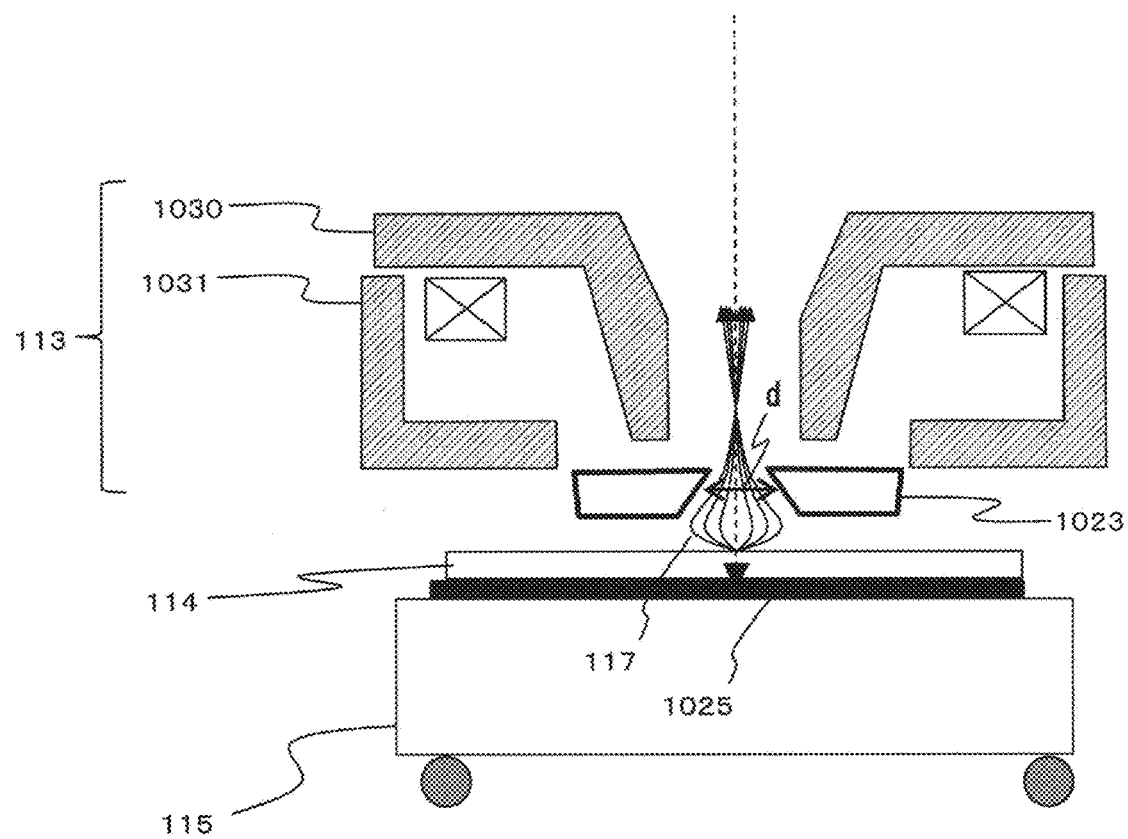

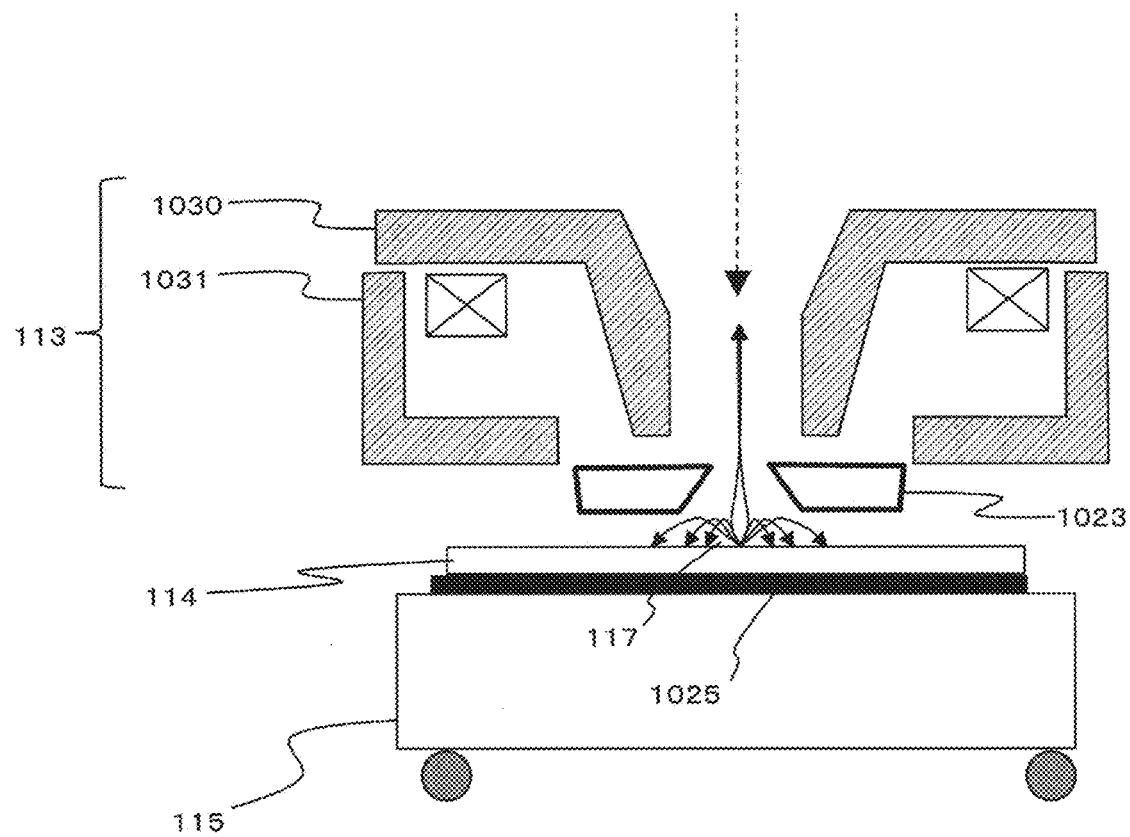
[FIG. 5]

[FIG. 6]
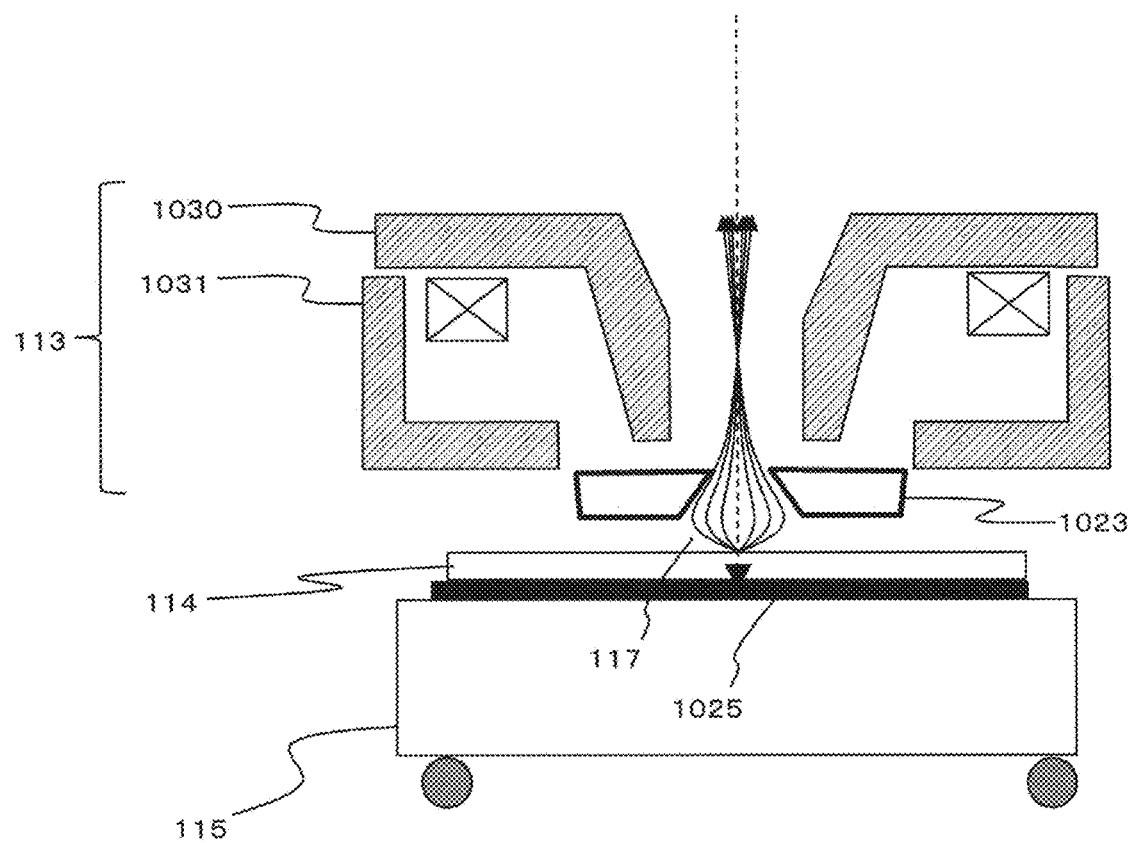

[FIG. 7]
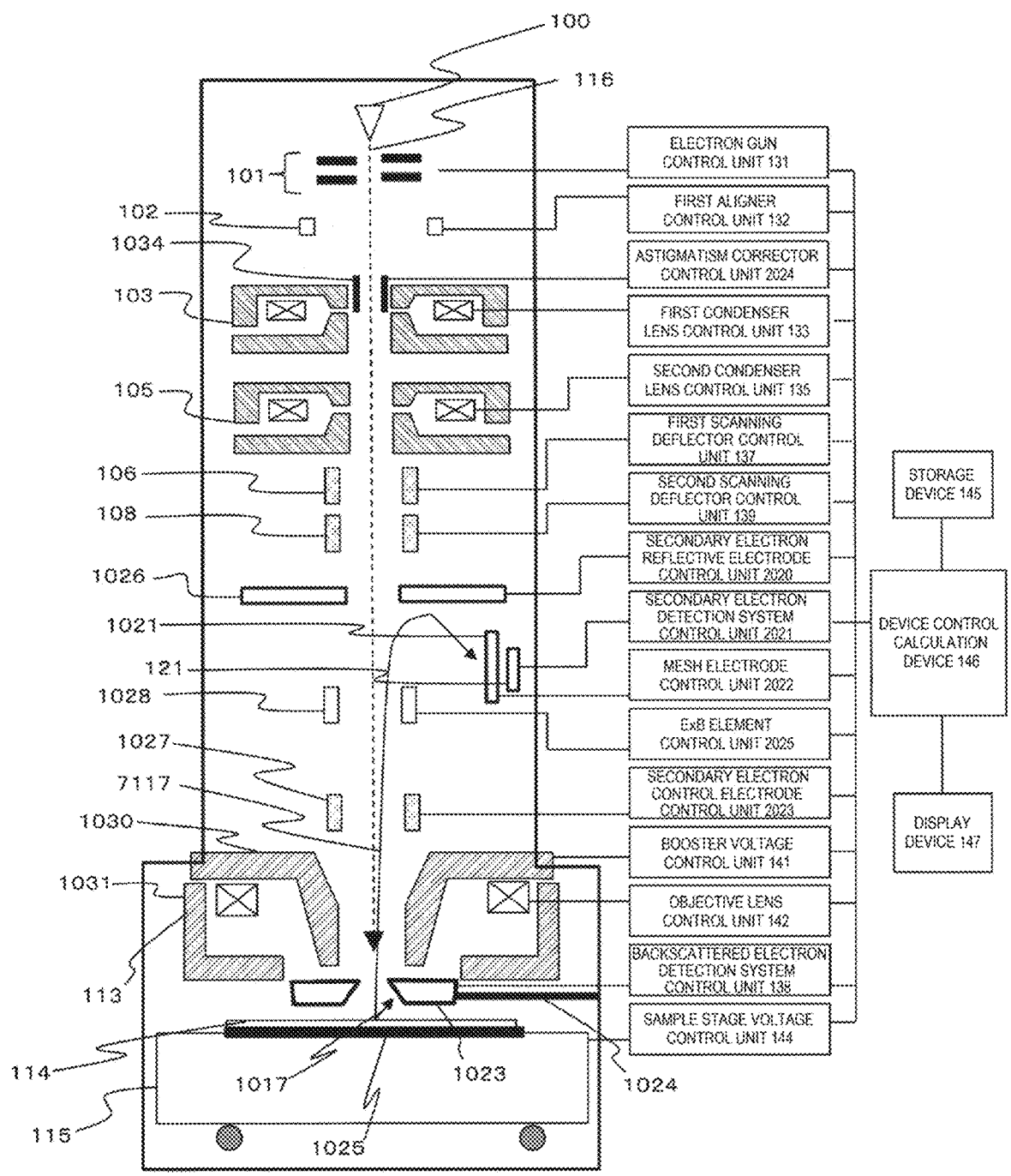

SCANNING ELECTRON MICROSCOPE

TECHNICAL FIELD

The present invention relates to a scanning electron microscope that performs inspection and measurement using an electron beam.

BACKGROUND ART

A scanning electron microscope (SEM) used for observation, inspection, and measurement of a sample using an electron beam accelerates electrons emitted from an electron source, focuses and emits the electrons onto a surface of the sample with an electrostatic lens or an electromagnetic lens. These electrons are referred to as primary electrons. Signal electrons (here, signal electrons having low energy are referred to as secondary electrons, and signal electrons having high energy are referred to as backscattered electrons) are emitted from the sample due to the emission of the primary electrons. By detecting the secondary electrons emitted from the sample while deflecting the electron beam and scanning the sample with the electron beam, a scanned image of a fine pattern on the sample can be obtained. It is also possible to form an absorption current image by detecting electrons absorbed by the sample. Regarding the detection of the secondary electrons, PTL 1 describes a method of controlling detection efficiency by applying a voltage to a secondary electron detector.

High speed has been developed to be one of important performances when the SEM is used for inspection and measurement. In addition to increasing a speed of stage movement and increasing a current of a probe current, it is also necessary to increase a speed of focus correction. There are a method using an electromagnetic lens and a method using an electrostatic electrode as a method of performing the focus correction, and the method using the electrostatic electrode is suitable for increasing the speed. PTL 2 discloses that an electrostatic electrode is provided in an objective lens in order to perform focus correction with the electrostatic electrode.

CITATION LIST

Patent Literature

PTL 1: JP-A-5-174768
PTL 2: JP-A-2007-95576

SUMMARY OF INVENTION

Technical Problem

In order to perform inspection and measurement of a three-dimensional structure such as a deep groove or a deep hole, a high acceleration electron beam is required. In order to perform focus correction on an electron beam having high energy by static electricity, a high correction voltage is required. Therefore, it is necessary to improve control efficiency of the focus correction. Further, by performing the focus correction, a side effect such as a change in the detection efficiency of the signal electrons needs to be reduced as much as possible.

Solution to Problem

A scanning electron microscope according to one embodiment of the invention includes an electron optical system including an electron source that emits an electron beam and an objective lens, a sample stage which is disposed on a stage and on which a sample is placed, a backscattered electron detector which is disposed between the objective lens and the sample stage and is configured to detect backscattered electrons emitted due to interaction between the electron beam and the sample, a backscattered electron detection system control unit which is provided corresponding to the backscattered electron detector and is configured to apply a voltage to the backscattered electron detector, and a device control calculation device. The objective lens has an opening in a stage direction, and the device control calculation device performs focus correction of the electron beam by controlling the voltage applied to the backscattered electron detector from the backscattered electron detection system control unit.

Advantageous Effect

Even in a scanning electron microscope using an electron beam having high energy, high-speed focus correction can be performed.

Other technical problems and novel characteristics will be apparent from a description of the present description and the accompanying drawings.

BRIEF DESCRIPTION OF DRAWINGS

FIG. 1 is an overall schematic diagram of a scanning electron microscope.

FIG. 2 is a diagram showing a relationship between a magnetic flux density distribution of an objective lens and a position of a backscattered electron detector.

FIG. 3 is a diagram showing an example of a trajectory of backscattered electrons.

FIG. 4 is a diagram showing an example of a trajectory of secondary electrons.

FIG. 5 is a diagram showing an example of a trajectory in which the secondary electrons are returned to a sample.

FIG. 6 is a diagram showing an example of a trajectory of the secondary electrons.

FIG. 7 is an overall schematic diagram of a scanning electron microscope.

DESCRIPTION OF EMBODIMENTS

Embodiments of the invention will be described below with reference to the drawings. Here, a scanning electron microscope (SEM) will be described as an example, but the invention can also be applied to an electron beam device other than the SEM.

An overall schematic diagram of an SEM shown in FIG. 1 will be described. An electron beam (primary electrons 116) emitted from an electron source 100 is accelerated by an electron gun 101, passes through a first condenser lens 103 and a second condenser lens 105, and is emitted to form an image on a sample 114 held on a sample stage 1025 on a stage 115 by an objective lens 113. A positive voltage can be applied from a booster voltage control unit 141 to an objective lens upper magnetic path 1030, and a negative voltage can be applied from a sample stage voltage control unit 144 to the sample 114, so that an electrostatic lens, a so-called deceleration optical system, can be formed. However, an electron optical system in the present embodiment is not used as the deceleration optical system. Further, an opening defined by the upper magnetic path 1030 and a lower magnetic path 1031 of the objective lens 113 faces the stage 115, and has a lens structure called a semi-in lens type. Accordingly, an electron beam having high resolution can be formed. An objective lens control unit 142 controls an exciting current flowing through an objective lens coil 112.

Secondary electrons 117 which have low energy and are emitted from the sample 114 are wound upward by an objective lens magnetic field and detected by a secondary electron detector 121 located upstream of the objective lens. The secondary electrons 117 receive deflection action caused by an ExB element 1028 upstream of the objective lens, pass through a mesh electrode 1021, and reach the secondary electron detector 121. The ExB element 1028 is an electron optical element capable of generating an electric field and a magnetic field orthogonal to each other. Since the secondary electron detector 121 attracts the secondary electrons 117 at a positive voltage, the mesh electrode 1021 plays a function of blocking a leakage electric field thereof. On the other hand, backscattered electrons 1017 having high energy are detected by a backscattered electron detector 1023 between the magnetic paths 1030 and 1031 of the objective lens and the sample stage 1025. The backscattered electron detector 1023 has a tapered hole facing the sample stage 1025, and detects the backscattered electrons 1017 on a tapered surface (inner wall of the hole) and a lower surface thereof. A backscattered electron detection system control unit 138 controls a voltage applied to the backscattered electron detector 1023, amplifies a signal detected by a detector, and sends the signal to a device control calculation device 146.

The sample is two-dimensionally scanned with the primary electrons 116 by a first scanning deflector 106 and a second scanning deflector 108, and as a result, a two-dimensional image of the sample can be obtained. The two-dimensional scanning is generally performed by performing horizontal line scanning while moving a start position thereof in a vertical direction. A center position of the two-dimensional image is defined by the first scanning deflector 106 controlled by a first scanning deflector control unit 137 and the second scanning deflector 108 controlled by a second scanning deflector control unit 139. Both the first scanning deflector 106 and the second scanning deflector 108 are electrostatic deflectors. The two-dimensional image is formed by the device control calculation device 146 and displayed on a display device 147. The electron gun 101 is controlled by an electron gun control unit 131, the first condenser lens 103 is controlled by a first condenser lens control unit 133, and the second condenser lens 105 is controlled by a second condenser lens control unit 135. A first aligner 102 which controls a beam axis of the primary electrons 116 is disposed following the electron gun 101, and the first aligner 102 is controlled by a first aligner control unit 132. The device control calculation device 146 which controls the entire device controls the electron optical system and a control unit of a detection system in a unified manner based on control data stored in a storage device 145. Detection signals detected by the two detectors 121 and 1023 are stored in the storage device 145 and displayed on the display device 147 to be used.

In order to obtain a high resolution with an electron microscope, it is effective to shorten a focal length of an objective lens. In the objective lens of the present embodiment, the opening defined by the magnetic paths is relatively directed toward the sample stage, and a peak of the lens magnetic field is below a lowermost surface of the magnetic paths. Accordingly, a focal length can be made shorter than a distance between the objective lens and the sample. In order to perform focus correction at a low voltage by using an electrostatic electrode, it is desirable to dispose the electrostatic electrode at a location where an intensity of the lens magnetic field is high. Therefore, when the focus correction is performed in the semi-in lens type objective lens as in the present embodiment, it is appropriate to provide an electrostatic correction electrode under the magnetic path of the objective lens 113. On the other hand, an important observation target of a high acceleration SEM is inspection measurement of a three-dimensional structure such as a deep groove or a deep hole. This is because it is difficult for the secondary electrons having low energy to escape from the deep groove or the deep hole, whereas the backscattered electrons having high energy can escape from the deep groove or the deep hole from a bottom of the groove or the hole. Therefore, in order to detect the backscattered electrons, the backscattered electron detector 1023 is provided directly above the sample. Therefore, the focus correction can be performed by applying a correction voltage to the backscattered electron detector 1023 provided between the magnetic path of the semi-in lens type objective lens and the sample stage, and it is effective in achieving both high-speed focusing and high resolution in a high-acceleration SEM. Further, as described above, since a correction electrode is most effective to be placed at the peak of the lens magnetic field, it is desirable that the backscattered electron detector 1023 is disposed in the vicinity of a position 200 where a magnetic flux density (magnetic field) of the objective lens 113 is a maximum value as shown in FIG. 2 in order to obtain high correction sensitivity. Therefore, it is more effective to set the position where the backscattered electron detector 1023 is disposed closer to a lower surface of the magnetic paths than the sample surface.

In PTL 2, an Einzel lens is used as an electrostatic lens for focus correction, and electrodes on both sides thereof are set to a ground potential. Therefore, an electrostatic lens field is restricted and a focus correction effect is reduced. In order to reduce the correction voltage, it is necessary to improve an effect of the correction voltage as much as possible. As in the present embodiment, the upper magnetic path 1030 of the objective lens 113, the backscattered electron detector 1023, and the sample 114 are electrostatic electrodes, and the correction voltage is applied to the backscattered electron detector 1023 to enable efficient electrostatic focus correction. Since the electron optical system of the present embodiment is not a deceleration optical system and in general the upper magnetic path 1030 of the objective lens 113 has a reference potential and a potential of the sample 114 is the reference potential to a slightly negative potential, the focus correction can be effectively performed by the correction voltage applied to the backscattered electron detector 1023.

In a case of a deceleration optical system often used in a low acceleration SEM, an electrostatic lens is formed by a booster voltage or a sample stage voltage in a manner of being superimposed on a magnetic field lens formed by the objective lens 113. Therefore, when an electrostatic focus correction function is further performed by the backscattered electron detector 1023, a side effect is generated in which a potential distribution of the superimposed electrostatic lens is greatly disturbed. Therefore, the present configuration is suitable for the electron optical system to which no deceleration optical system such as a high-acceleration SEM is applied.

However, there are a plurality of problems in doubling the backscattered electron detector and the electrostatic correction electrode for the focus correction. One of the problems is an alignment error between the backscattered electron detector 1023 and the objective lens 113. Specifically, the alignment error is an error between central axes of the backscattered electron detector 1023 and the objective lens 113 and an error of parallelism. When only the backscattered electrons 1017 are simply detected, there is no problem with a slight positional deviation and inclination. However, when the backscattered electron detector 1023 is operated as an optical element by applying a correction voltage, it is necessary to reduce these mechanical errors. The mechanical error may cause a field-of-view shift, a change in the emission angle, and further astigmatism when the focus correction is performed. Therefore, a support 1024 is provided between the objective lens 113 and the sample stage 1025 as shown in FIG. 1 so that a position and inclination of the backscattered electron detector 1023 can be adjusted.

Further, in order to correct the field-of-view shift, the change in the emission angle, and the astigmatism caused by focus correction, it is desirable to offset effects by operating deflectors (106 and 108) and an astigmatism corrector 1034 in conjunction with electrostatic correction. The correction for the field-of-view shift or the emission angle caused by the two-stage deflector and the correction for the astigmatism caused by the astigmatism corrector are known techniques, and detailed description thereof will be omitted. An interlocking operation with the focus correction may be performed in parallel with the focus correction or in order.

Another problem is that sensitivity of the backscattered electron detector 1023 may change. As shown in FIG. 3, the backscattered electrons 1017 are directly input to the backscattered electron detector 1023. For example, a scintillator is used for the backscattered electron detector 1023, and the detection is performed by converting electrons into light. Since an emission intensity of the scintillator is determined in proportion to energy of the emitted electrons, for example, when a 1 kV voltage is applied to the backscattered electron detector 1023, backscattered electrons of 10 kV generated in the sample 114 are detected as backscattered electrons of 11 kV, and the emission intensity is increased by about 10%. A change in the emission intensity is a change in brightness of an SEM image formed based on the detected backscattered electrons. That is, the change in the brightness of the SEM image occurs in accordance with the focus correction, which may cause a decrease in an accuracy of the inspection and measurement. The same applies to a case where a photomultiplier or a photomultiplier tube is used as the backscattered electron detector.

As a first method, the change in the brightness of the SEM image is reduced to a degree that does not lead to a decrease in the accuracy of the inspection and measurement. Specifically, in order to reduce the change in the brightness to a predetermined ratio or less, for example, a control range of the correction voltage is regulated based on an acceleration voltage of the primary electrons 116. For example, when the acceleration voltage of the primary electrons 116 is regulated to 10% or less, the control range of the correction voltage is 300 V or less for the primary electrons having an acceleration voltage of 30 kV, and fluctuation in the brightness of the SEM image is reduced.

As a second method, a signal amplification factor in the backscattered electron detection system control unit 138 is changed. Specifically, by controlling the signal amplification factor in accordance with the correction voltage, it is possible to reduce the effect of the focus correction from the SEM image.

Another problem is that an efficiency of secondary electron detection by the secondary electron detector 121 changes. FIG. 4 is a diagram showing a trajectory of the secondary electrons 117. The secondary electrons 117 pass through the objective lens 113 and are detected upstream. In the present embodiment, in order to reduce the correction voltage for the focus correction, it is desirable to make an inner diameter d of the backscattered electron detector 1023 as small as possible. However, reducing the inner diameter d of the backscattered electron detector 1023 may make the backscattered electron detector 1023 an obstacle, thereby the number of the secondary electrons 117 reaching the secondary electron detector 121 may be reduced.

Therefore, a shape of the hole of the backscattered electron detector 1023 is a tapered shape in which an inner diameter increases toward the sample stage. The hole is provided to allow the primary electrons and the secondary electrons to pass through. As shown in FIG. 4, the secondary electrons 117 from the sample 114 are once spread out of an axis, are focused on the axis by a magnetic field formed by the objective lens 113, and pass through the objective lens 113. In this way, by forming the hole of the backscattered electron detector 1023 in a tapered shape extending toward the sample, it is possible to prevent the secondary electrons 117 from colliding with the backscattered electron detector 1023 before the secondary electrons 117 are focused on the axis and from returning to the sample. On the other hand, since the intensity of the magnetic field of the objective lens 113 is relatively small in a place close to the sample as shown in FIG. 2, the sensitivity of the electrostatic correction does not greatly decrease due to the tapered shape. In this way, by forming the hole of the backscattered electron detector 1023 into the tapered shape, it is possible to reduce the effect on the secondary electron detection without significantly impairing a performance of an electrostatic corrector.

Another problem is to change the efficiency of the secondary electron detection by the secondary electron detector 121. FIG. 5 shows an example of a trajectory of the secondary electrons 117 when a large negative voltage is applied to the backscattered electron detector 1023 as the correction voltage. In this case, many secondary electrons are drawn back onto the sample by the negative voltage of the backscattered electron detector 1023, and cannot escape above the backscattered electron detector 1023. Therefore, a detection rate of the secondary electrons 117 is greatly reduced. Therefore, a voltage which is positive with respect to the voltage applied to the sample stage 1025 is applied to the backscattered electron detector 1023 as the correction voltage so that the voltage does not interfere with the secondary electrons 117 passing through the backscattered electron detector 1023.

When the correction voltage is a positive voltage, the focus correction causes a focal position to move downstream (in a direction from the electron source to the sample). In other words, the electrostatic focus correction will be used to increase the focal length only. Therefore, the focal position of the electromagnetic lens is roughly adjusted in a state in which an offset voltage of a predetermined positive voltage is applied to the backscattered electron detector 1023. Accordingly, the focal position can be adjusted both upstream and downstream while the correction voltage remains at the positive voltage.

FIG. 6 shows an example of a trajectory of the secondary electrons 117 when a positive voltage is applied to the backscattered electron detector 1023 as the correction voltage. When the positive voltage is applied to the backscattered electron detector 1023, the secondary electrons 117 are accelerated to draw a trajectory in which a lens effect of the objective lens 113 is smaller than that in FIG. 4. This trajectory change may fluctuate the detection efficiency of the secondary electrons.

An overall schematic diagram of an SEM corresponding to this problem is shown in FIG. 7. The same components as those of the SEM shown in FIG. 1 are denoted by the same reference numerals, and a repetitive description thereof will be omitted. In a configuration of FIG. 7, as one configuration for reducing fluctuation in a detection efficiency of secondary electrons, a cylindrical secondary electron control electrode 1027 is provided upstream of the objective lens 113 (electron source side) to control a trajectory of secondary electrons 7117. A secondary electron control electrode control unit 2023 can stabilize a detection rate of the secondary electrons regardless of a focus correction operation by applying a voltage in conjunction with a correction voltage applied to the backscattered electron detector 1023 to the secondary electron control electrode 1027.

Further, as another configuration for reducing the fluctuation in the detection efficiency of the secondary electrons, a disk-shaped secondary electron reflective electrode 1026 having a hole for passing the primary electrons 116 is provided upstream of the mesh electrode 1021. A voltage lower than a voltage applied to the sample stage 1025 by a secondary electron reflective electrode control unit 2020 is applied to the secondary electron reflective electrode 1026. In this example, since a negative voltage is applied to the sample stage 1025, the voltage applied to the secondary electron reflective electrode 1026 is also a negative voltage. Accordingly, the secondary electrons 7117 escaping above the mesh electrode 1021 due to a trajectory change caused by the focus correction can be guided in a mesh electrode direction. In this way, since the secondary electrons can be stably guided to the mesh electrode 1021 even when the trajectory change of the secondary electrons slightly occurs, the detection efficiency of the secondary electrons for the focus correction is stabilized. Any one of the configurations for reducing the fluctuation in the detection efficiency of the secondary electrons described above may be used, or both of them may be used as shown in FIG. 7.

The invention has been described above based on the embodiments. The invention is not limited to the above-mentioned embodiments, and includes various modifications. For example, the embodiments described above have been described for easy understanding of the invention, and is not necessarily limited to those including all the configurations described above. Further, a part of a configuration of a certain embodiment can be replaced with a configuration of another embodiment or the configuration of the other embodiment can be added to the configuration of the certain embodiment. A part of the configuration of each embodiment may be added to, deleted from, or replaced with another configuration.

REFERENCE SIGN LIST

100 electron source
101 electron gun
102 first aligner
103 first condenser lens
105 second condenser lens
106 first scanning deflector
108 second scanning deflector
113 objective lens
114 sample
115 stage
116 primary electron
117 secondary electron
131 electron gun control unit
132 first aligner control unit
133 first condenser lens control unit
135 second condenser lens control unit
137 first scanning deflector control unit
138 backscattered electron detection system control unit
139 second scanning deflector control unit
141 booster voltage control unit
142 objective lens control unit
144 sample stage voltage control unit
145 storage device
146 device control calculation device
147 display device
1017 backscattered electron
1021 mesh electrode
1023 backscattered electron detector
1024 support
1025 sample stage
1026 secondary electron reflective electrode
1027 secondary electron control electrode
1028 ExB element
1030 upper magnetic path
1031 lower magnetic path
1034 astigmatism corrector
2020 secondary electron reflective electrode control unit
2021 secondary electron detection system control unit
2022 mesh electrode control unit
2023 secondary electron control electrode control unit
2024 astigmatism corrector control unit
2025 ExB element control unit
7117 secondary electron

The invention claimed is:

1. A scanning electron microscope comprising:
an electron optical system including an electron source that emits an electron beam and an objective lens;
a sample stage which is disposed on a stage and on which a sample is placed;
a backscattered electron detector which is disposed between the objective lens and the sample stage and is configured to detect backscattered electrons emitted due to interaction between the electron beam and the sample;
a backscattered electron detection system control unit which is provided corresponding to the backscattered electron detector and is configured to apply a voltage to the backscattered electron detector; and
a device control calculation device, wherein
the objective lens has an opening in a stage direction, and
the device control calculation device performs focus correction of the electron beam by controlling the voltage applied to the backscattered electron detector from the backscattered electron detection system control unit.

2. The scanning electron microscope according to claim 1, wherein
the electron optical system does not apply a deceleration optical system.

3. The scanning electron microscope according to claim 1, wherein
the backscattered electron detector is held by a support configured to adjust a position and inclination of the backscattered electron detector.

4. The scanning electron microscope according to claim 3, wherein the backscattered electron detector is provided at a height covering a peak position of a magnetic field of the objective lens.

5. The scanning electron microscope according to claim 1, further comprising:
a deflector control unit which is provided corresponding to a deflector included in the electron optical system and is configured to control deflection of the electron beam, wherein
the device control calculation device corrects a field-of-view shift due to the focus correction or an emission angle of the electron beam by controlling the deflector control unit in conjunction with the voltage applied to the backscattered electron detector from the backscattered electron detection system control unit.

6. The scanning electron microscope according to claim 1, further comprising:
an astigmatism corrector control unit which is provided corresponding to an astigmatism corrector included in the electron optical system and is configured to control astigmatism of the electron beam, wherein
the device control calculation device corrects the astigmatism of the electron beam due to the focus correction by controlling the astigmatism corrector control unit in conjunction with the voltage applied to the backscattered electron detector from the backscattered electron detection system control unit.

7. The scanning electron microscope according to claim 1, wherein
the voltage applied to the backscattered electron detector from the backscattered electron detection system control unit is regulated based on an acceleration voltage of the electron beam.

8. The scanning electron microscope according to claim 1, wherein
the backscattered electron detection system control unit controls a signal amplification factor of a signal from the backscattered electron detector in accordance with the voltage applied to the backscattered electron detector from the backscattered electron detection system control unit.

9. The scanning electron microscope according to claim 1, further comprising:
a secondary electron detector which is disposed upstream of the objective lens and is configured to detect secondary electrons emitted due to the interaction between the electron beam and the sample, wherein
the backscattered electron detector has a hole through which the electron beam and the secondary electrons pass, and the hole has a tapered shape whose inner diameter increases toward the sample stage.

10. The scanning electron microscope according to claim 9, wherein
the backscattered electron detection system control unit applies a voltage which is positive with respect to a voltage applied to the sample stage to the backscattered electron detector.

11. The scanning electron microscope according to claim 10, wherein
the voltage applied to the backscattered electron detector from the backscattered electron detection system control unit has a positive offset voltage.

12. The scanning electron microscope according to claim 9, further comprising:
a secondary electron reflective electrode provided upstream of a mesh electrode which blocks a leakage electric field of the secondary electron detector, wherein
a voltage lower than the voltage applied to the sample stage is applied to the secondary electron reflective electrode.

13. The scanning electron microscope according to claim 9, further comprising:
a secondary electron control electrode which is provided upstream of the objective lens and is configured to control a trajectory of the secondary electrons; and
a secondary electron control electrode control unit provided corresponding to the secondary electron control electrode, wherein
the device control calculation device reduces fluctuation in secondary electron detection efficiency of the secondary electron detector by controlling the secondary electron control electrode control unit in conjunction with the voltage applied to the backscattered electron detector from the backscattered electron detection system control unit.

* * * * *